(12) United States Patent
Lue

(10) Patent No.: US 11,742,025 B2
(45) Date of Patent: Aug. 29, 2023

(54) MEMORY DEVICE AND OPERATION METHOD THEREOF

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 127 days.

(21) Appl. No.: 17/321,670

(22) Filed: May 17, 2021

(65) Prior Publication Data

US 2022/0366987 A1 Nov. 17, 2022

(51) Int. Cl.
*G11C 16/08* (2006.01)
*G11C 16/26* (2006.01)
*G11C 16/14* (2006.01)

(52) U.S. Cl.
CPC ........... *G11C 16/08* (2013.01); *G11C 16/14* (2013.01); *G11C 16/26* (2013.01)

(58) Field of Classification Search
CPC .. G11C 16/0458; G11C 16/24; G11C 12/0028
See application file for complete search history.

(56) References Cited

U.S. PATENT DOCUMENTS

| | | | |
|---|---|---|---|
| 9,768,234 B2 | 9/2017 | Jo | |
| 10,453,896 B1 | 10/2019 | Nazarian et al. | |
| 2010/0265773 A1* | 10/2010 | Lung | H01L 27/10 365/185.23 |
| 2016/0293260 A1* | 10/2016 | Tran | G11C 16/24 |
| 2021/0091083 A1 | 3/2021 | Kato | |
| 2021/0288058 A1 | 9/2021 | Nishimura et al. | |
| 2022/0189549 A1* | 6/2022 | Fratin | G11C 13/0028 |

OTHER PUBLICATIONS

Non-Final Office Action issued in U.S. Appl. No. 16/931,598, filed Jul. 17, 2020, dated Nov. 16, 2021.
Final Office Action mailed in Utility U.S. Appl. No. 16/931,598, filed Jul. 17, 2020, dated Mar. 9, 2022.

* cited by examiner

*Primary Examiner* — Jason Lappas
(74) *Attorney, Agent, or Firm* — McClure, Qualey & Rodack, LLP

(57) ABSTRACT

A memory device and an operation method thereof are provided. The memory device comprises: a memory array including a plurality of memory cells; a first local signal line decoder coupled to the memory array; a second local signal line decoder coupled to the memory array; and a controller coupled to and controlling the memory array, the first local signal line decoder and the second local signal line decoder, wherein in programming, a threshold voltage distribution of the memory cells is lower than a read voltage; and in erase, the threshold voltage distribution of the memory cells is higher than the read voltage.

16 Claims, 6 Drawing Sheets

MEMORY DEVICE AND OPERATION METHOD THEREOF

TECHNICAL FIELD

The disclosure relates in general to a memory device and an operation thereof.

BACKGROUND

Now, 3D (three-dimension) stacking is developed in the memory device to improve memory density.

In 3D structure memory device, besides 3D NAND flash memory and 3D NOR flash memory, 3D AND flash memory is also developed. In 3D NAND flash memory, the memory transistors are serially connected and in 3D AND flash memory, the memory transistors are parallel connected.

In erasing the memory device, an over erase issue is occurred and the erase speed may be slow. Besides, due to the slow erase speed, the threshold (Vt) distribution is also wide. Thus, the performance of the 3D memory device is negatively affected.

SUMMARY

According to one embodiment, provided is a memory device comprising: a memory array including a plurality of memory cells; a first local signal line decoder coupled to the memory array; a second local signal line decoder coupled to the memory array; and a controller coupled to and controlling the memory array, the first local signal line decoder and the second local signal line decoder, wherein in programming, a threshold voltage distribution of the memory cells is lower than a read voltage; and in erase, the threshold voltage distribution of the memory cells is higher than the read voltage.

According to another embodiment, provided is an operation method for a memory device including a memory array having a plurality of memory cells. The operation method comprises: in programming, applying a second global signal line voltage to a first target memory cell among the memory cells, wherein a first threshold voltage distribution of the first target memory cell is lower than a read voltage; and in erase, applying a first global signal line voltage to a second target memory cell among the memory cells, wherein a second threshold voltage distribution of the second target memory cell is higher than the read voltage.

Figure 1:
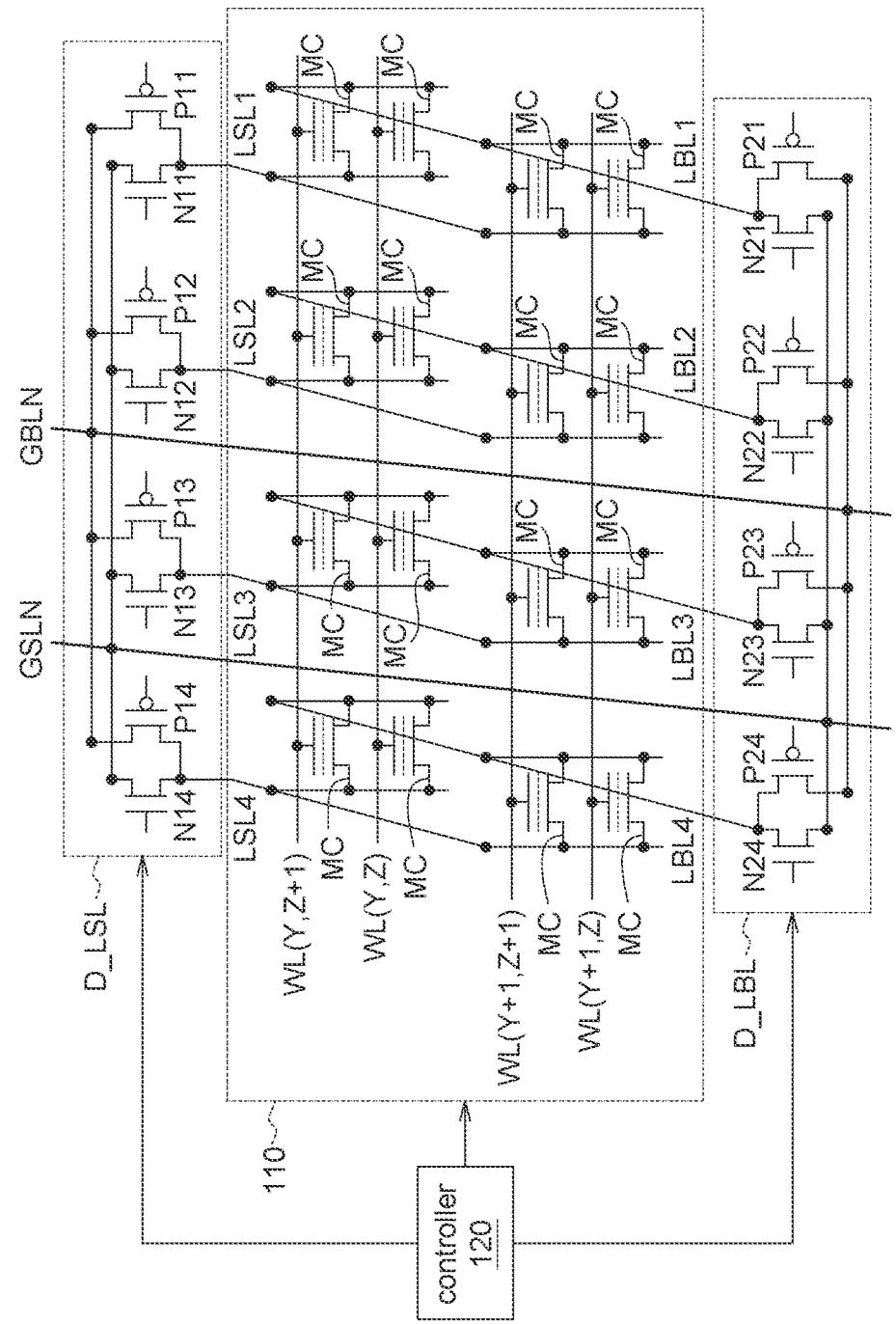
FIG. 1 shows a circuit diagram of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Now refer to FIG. 1 which shows a circuit diagram of a memory device according to one embodiment of the application. As shown in FIG. 1, the memory device 100 according to one embodiment of the application includes a memory array 110, a controller 120, a local source line decoder D_LSL and a local bit line decoder D_LBL. The memory array 110 includes a plurality of memory cells MC arranged in an array. The memory cells MC are coupled to a plurality of word lines (for example but not limited by, WL(Y, Z), WL(Y, Z+1), WL(Y+1, Z), WL(Y+1, Z+1), a plurality of local source lines (for example but not limited by, LSL1~LSL4) and a plurality of local bit lines (for example but not limited by, LBL1~LBL4). The controller 120 is coupled to the memory array 110, the local source line decoder D_LSL and the local bit line decoder D_LBL, for controlling the memory array 110, the local source line decoder D_LSL and the local bit line decoder D_LBL. For example but not limited by, The controller 120 controls the read operations, the programming operations and the erase operations, the stress recovery operations of the memory array 110.

The local source line decoder D_LSL is coupled to the memory array 110. The local source line decoder D_LSL includes PMOS transistors P11~P14 and NMOS transistors N11~N14. The PMOS transistors P11~P14 and NMOS transistors N11~N14 form a plurality of CMOS (Complementary Metal-Oxide-Semiconductor) decoders (or said, a plurality of first CMOS units) each including a PMOS transistor and an NMOS transistor.

Similarly, the local bit line decoder D_LBL is coupled to the memory array 110. The local bit line decoder D_LBL includes PMOS transistors P21~P24 and NMOS transistors N21~N24. The PMOS transistors P21~P24 and NMOS transistors N21~N24 form a plurality of CMOS decoders (or said, a plurality of second CMOS units) each including a PMOS transistor and an NMOS transistor.

Taking the PMOS transistor P11 as an example, the PMOS transistor P11 includes: a first terminal (for example the source terminal) coupled to the local source line LSL1, a second terminal (for example, the drain terminal) coupled to one (for example, GBLN) of the global bit lines and a control terminal (for example the gate terminal) receiving a control signal (not shown). The PMOS transistors P12~P14 have similar coupling relationship as the PMOS transistor P11.

Similarly, Taking the PMOS transistor P21 as an example, the PMOS transistor P21 includes: a first terminal (for example the source terminal) coupled to the local bit line LBL1, a second terminal (for example, the drain terminal) coupled to one (for example, GBLN) of the global bit lines and a control terminal (for example the gate terminal)

receiving a control signal (not shown). The PMOS transistors P22~P24 have similar coupling relationship as the PMOS transistor P21.

Taking the NMOS transistor N11 as an example, the NMOS transistor N11 includes: a first terminal (for example the source terminal) coupled to the local source line LSL1, a second terminal (for example, the drain terminal) coupled to one (for example, GSLN) of the global source lines and a control terminal (for example the gate terminal) receiving a control signal (not shown). The NMOS transistors N12~N14 have similar coupling relationship as the NMOS transistor N11.

Taking the NMOS transistor N21 as an example, the NMOS transistor N21 includes: a first terminal (for example the source terminal) coupled to the local bit line LBL1, a second terminal (for example, the drain terminal) coupled to one (for example, GSLN) of the global source lines and a control terminal (for example the gate terminal) receiving a control signal (not shown). The NMOS transistors N22~N24 have similar coupling relationship as the NMOS transistor N21.

Each of the PMOS transistors P11~P14, the PMOS transistors P21~P24, the NMOS transistors N11~N14 and the NMOS transistors N22~N24 is independently controlled in the read operations, the erase operations, the programming operation and the stress recovery operations on the memory cells MC.

Now, operations of the local source line decoder D_LSL and the local bit line decoder D_LBL are described.

For the local source line decoder D_LSL, when at least one of the NMOS transistors N11~N14 of the local source line decoder D_LSL is turned on, the voltage on the global source line GSLN is conducted to the local source line and thus a first terminal of the memory cell is pulled down to the voltage on the global source line GSLN. Similarly, when at least one of the PMOS transistors P11~P14 of the local source line decoder D_LSL is turned on, the voltage on the global bit line GBLN is conducted to the local source line and thus the first terminal of the memory cell is pulled up to the voltage on the global bit line GBLN.

Similarly, for the local bit line decoder D_LBL, when at least one of the NMOS transistors N21~N24 of the local bit line decoder D_LBL is turned on, the voltage on the global source line GSLN is conducted to the local bit line and thus a second terminal of the memory cell is pulled down to the voltage on the global source line GSLN. Similarly, when at least one of the PMOS transistors P21~P24 of the local bit line decoder D_LBL is turned on, the voltage on the global bit line GBLN is conducted to the local bit line and thus the second terminal of the memory cell is pulled up to the voltage on the global bit line GBLN.

Figure 2:
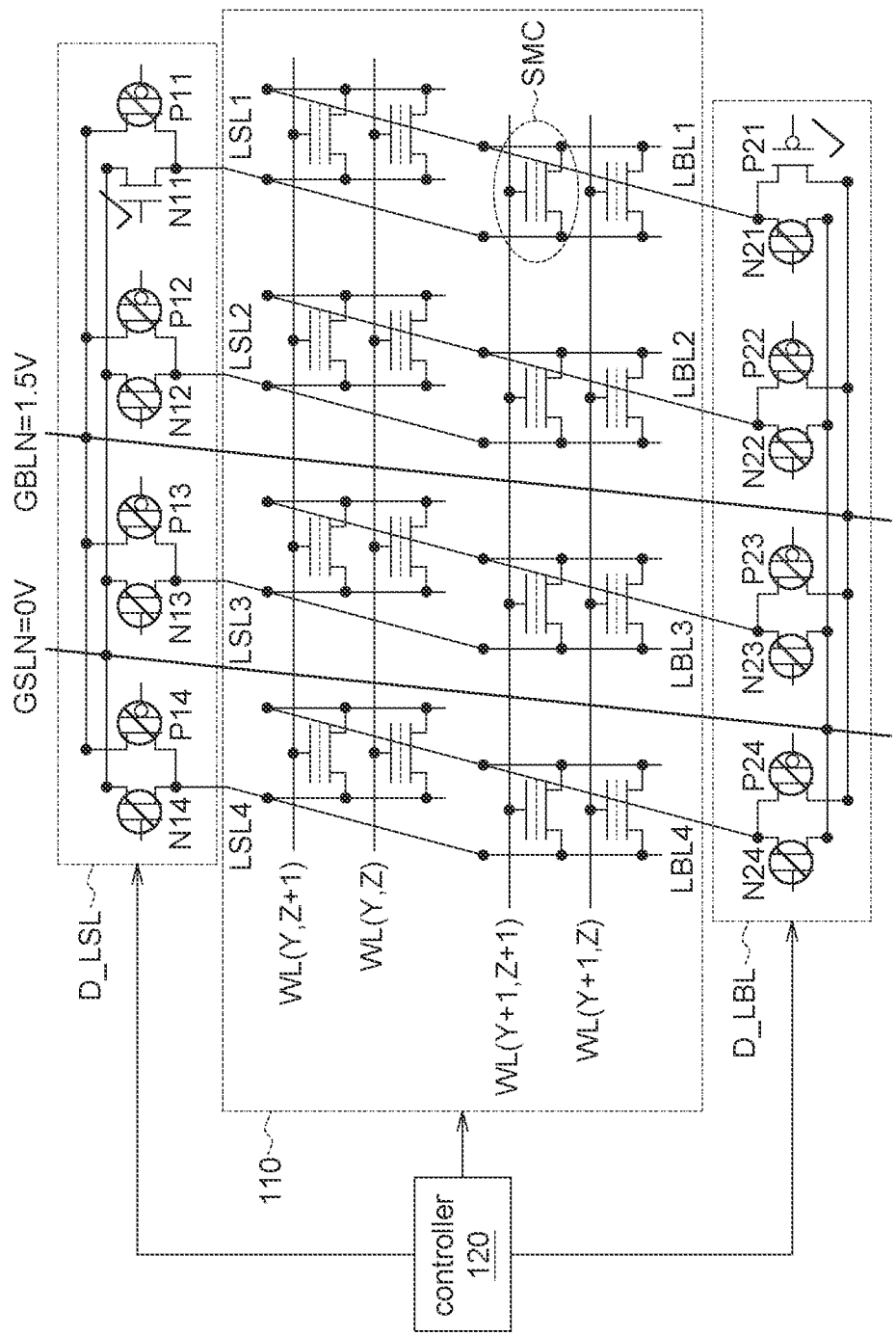
FIG. 2 shows the read operations according to one embodiment of the application.

FIG. 2 shows the read operations according to one embodiment of the application. As shown in FIG. 2, in the local source line decoder D_LSL, the PMOS transistor (for example P11) coupled to the selected memory cell SMC is inactive and other PMOS transistors (P12~P14) are also inactive; and the NMOS transistor (for example N11) coupled to the selected memory cell SMC is active and other NMOS transistors (N12~N14) are inactive. In the local bit line decoder D_LBL, the PMOS transistor (for example P21) coupled to the selected memory cell SMC is active and other PMOS transistors (P22~P24) are inactive; and the NMOS transistor (for example N21) coupled to the selected memory cell SMC is inactive and other NMOS transistors (N22~N24) are inactive. Thus, the first terminal of the selected memory cell SMC is biased to the voltage on the global source line GSLN (for example but not limited by, 0V) and the second terminal voltage of the selected memory cell SMC is biased to the voltage on the global bit line GBLN (for example but not limited by, 1.5V). The word line (for example WL(Y+1, Z+1)) coupled to the selected memory cell SMC is biased to for example but not limited by, 5V to conduct the selected memory cell SMC. Other unselected word line is biased to for example but not limited by 0V. By the operations, the selected memory cell SMC is read. Of course, the voltage values are for example and the application is not limited by.

That is, in one embodiment of the application, in reading, the local source decoder conducts a global source line voltage to a first target memory cell of the memory cells; and the local bit line decoder conducts a global bit line voltage to the first target memory cell of the memory cells.

Figure 3:
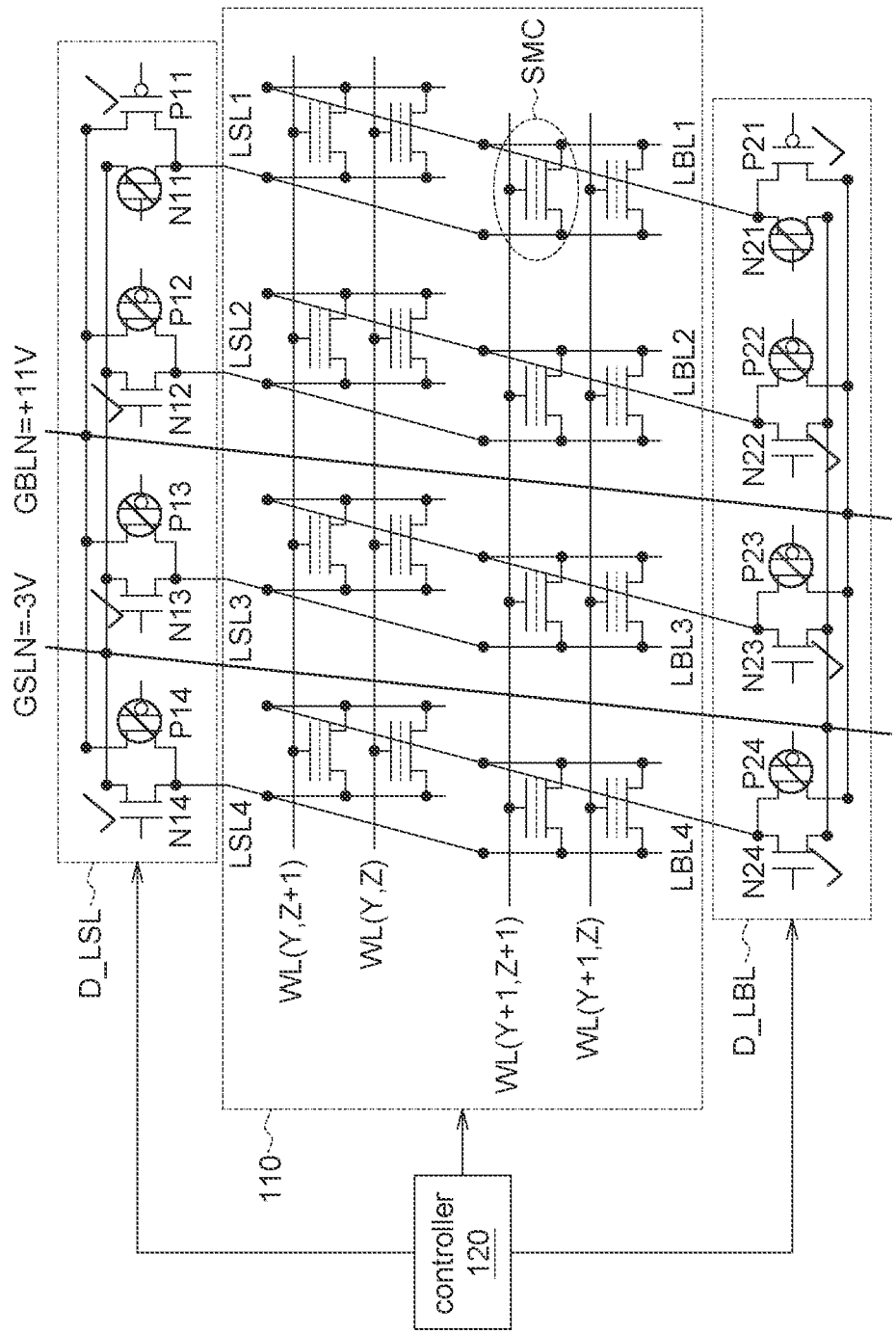
FIG. 3 shows the programming operations according to one embodiment of the application.

FIG. 3 shows the programming operations according to one embodiment of the application. As shown in FIG. 3, in the local source line decoder D_LSL, the PMOS transistor (for example P11) coupled to the selected memory cell SMC is active and other PMOS transistors (P12~P14) are inactive; and the NMOS transistor (for example N11) coupled to the selected memory cell SMC is inactive and other NMOS transistors (N12~N14) are active. In the local bit line decoder D_LBL, the PMOS transistor (for example P21) coupled to the selected memory cell SMC is active and other PMOS transistors (P22~P24) are inactive; and the NMOS transistor (for example N21) coupled to the selected memory cell SMC is inactive and other NMOS transistors (N22~N24) are active. Thus, the first terminal of the selected memory cell SMC is biased to the voltage on the global bit line GBLN (for example but not limited by, +11V) and the second terminal voltage of the selected memory cell SMC is biased to the voltage on the global bit line GBLN (for example but not limited by, +11V). The word line (for example WL(Y+1, Z+1)) coupled to the selected memory cell SMC is biased to for example but not limited by, −11V. Other unselected word line is biased to for example but not limited by +3V. By the operations, the gate-source voltage of the selected memory cell SMC is −11V−11V=−22V and thus the selected memory cell SMC is programmed. The gate-source voltage (for example, −8V or +6V) of the unselected memory cell is not so low and thus the unselected memory cell is not programmed. Of course, the voltage values are for example and the application is not limited by.

That is, in one embodiment of the application, in programming, the gate-source voltage of the selected memory cell is low-level voltage (for example but not limited by, −22V).

In one embodiment of the application, in programming, the local source decoder conducts a global bit line voltage to a second target memory cell of the memory cells; and the local bit line decoder conducts the global bit line voltage to the second target memory cell of the memory cells.

Figure 4:
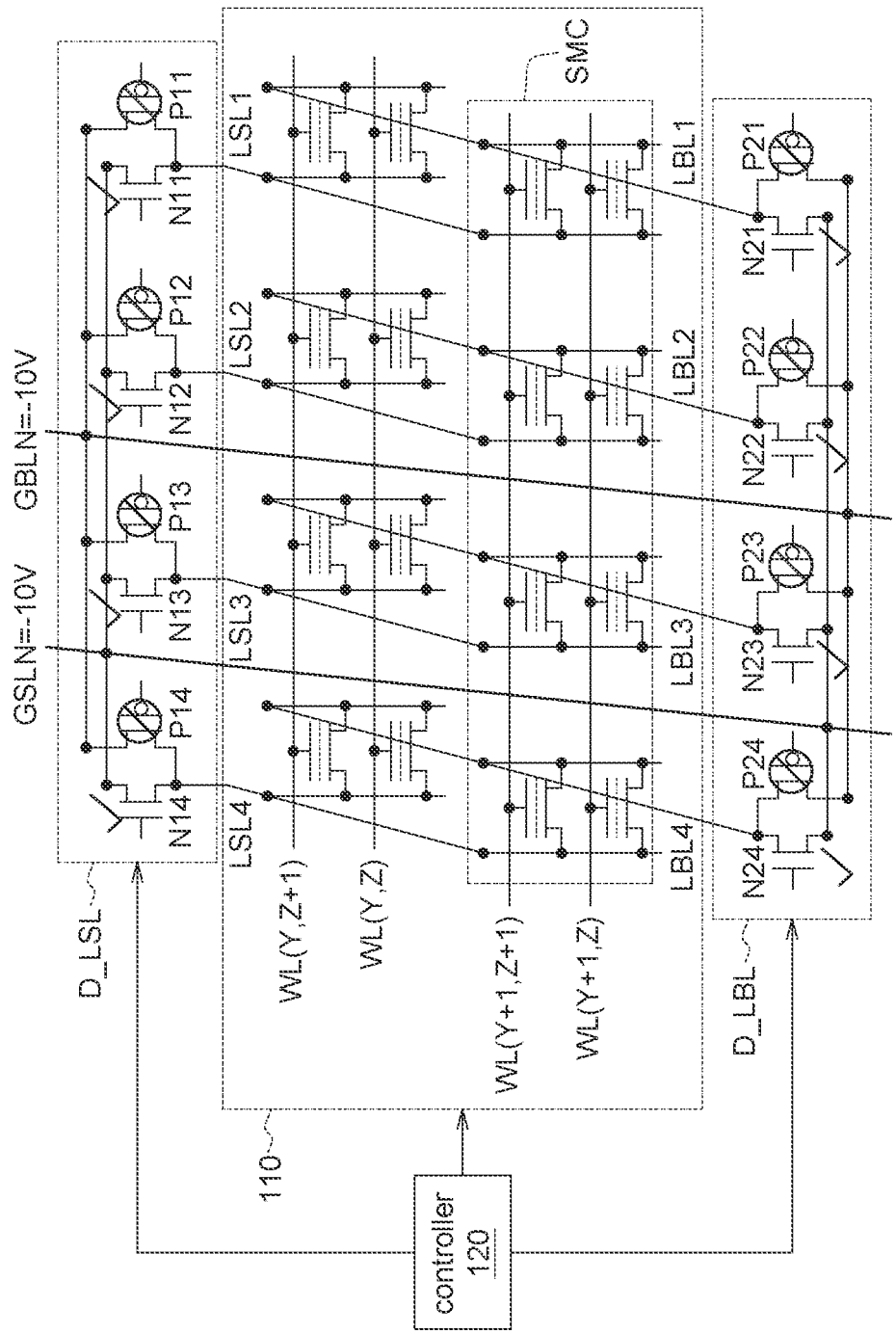
FIG. 4 shows the erase operations according to one embodiment of the application.

FIG. 4 shows the erase operations according to one embodiment of the application. In erasing, the memory cells coupled to several selected word lines are erase at the same time. As shown in FIG. 4, in the local source line decoder D_LSL, the PMOS transistors P11~P14 are inactive; and the NMOS transistors N11~N14 are active. In the local bit line decoder D_LBL, the PMOS transistors P21~P24 are inactive; and the NMOS transistors N21~N24 are active. Thus, the first terminal of the selected memory cell SMC is biased to the voltage on the global source line GSLN (for example but not limited by, −10V) and the second terminal voltage of the selected memory cell SMC is biased to the voltage on the global source line GSLN (for example but not limited by, −10V). The word line (for example WL(Y+1, Z+1)) coupled to the selected memory cell SMC is biased to for example but not limited by, +12V. Other unselected word line is biased to for example but not limited by −2V. By the operations, the gate-source voltage of the selected memory cells SMC is +12−(−10V)=+22V and thus the selected memory cells SMC are erased. The gate-source voltage of the unselected memory cells is −2V−(−10V)=+8V and thus the unselected memory cells are not erased. By the operations, the selected memory cells SMC are erased. Of course, the voltage values are for example and the application is not limited by.

That is, in one embodiment of the application, in erase, the gate-source voltage of the selected memory cell is high-level voltage (for example but not limited by, +22V).

In one embodiment of the application, in erase, the local source decoder conducts a global source line voltage to a third target memory cell of the memory cells; and the local bit line decoder conducts the global source line voltage to the third target memory cell of the memory cells.

Figure 5:
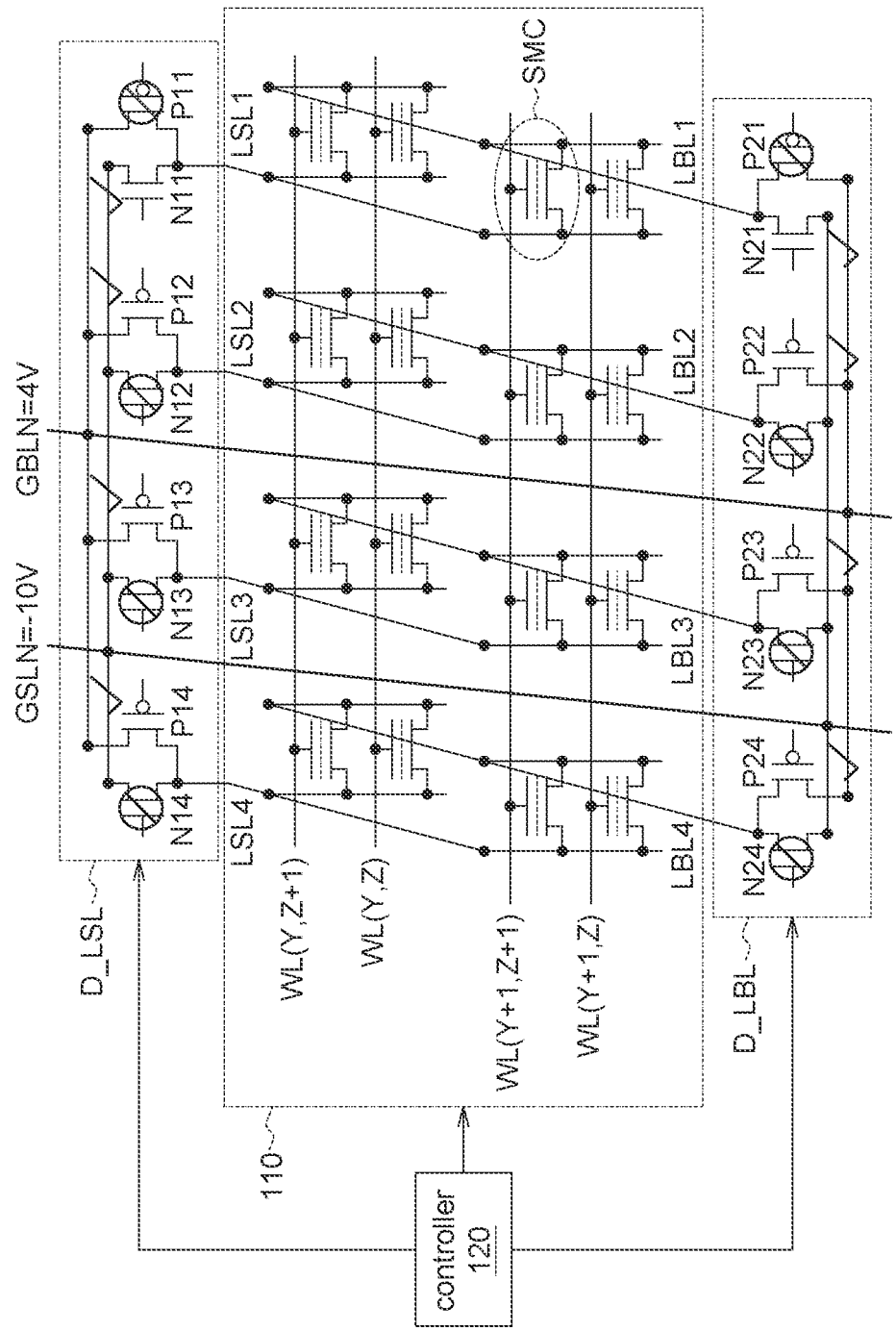
FIG. 5 shows the stress recovery operations according to one embodiment of the application.

FIG. 5 shows the stress recovery operations according to one embodiment of the application. As shown in FIG. 5, in the local source line decoder D_LSL, the PMOS transistor (for example P11) coupled to the selected memory cell SMC is inactive and other PMOS transistors (P12~P14) are active; and the NMOS transistor (for example N11) coupled to the selected memory cell SMC is active and other NMOS transistors (N12~N14) are inactive. In the local bit line decoder D_LBL, the PMOS transistor (for example P21) coupled to the selected memory cell SMC is inactive and other PMOS transistors (P22~P24) are active; and the NMOS transistor (for example N21) coupled to the selected memory cell SMC is active and other NMOS transistors (N22~N24) are inactive. Thus, the first terminal of the selected memory cell SMC is biased to the voltage on the global source line GSLN (for example but not limited by, −10V) and the second terminal voltage of the selected memory cell SMC is biased to the voltage on the global source line GSLN (for example but not limited by, −10V). The word line (for example WL(Y+1, Z+1)) coupled to the selected memory cell SMC is biased to for example but not limited by, +12V. Other unselected word line is biased to for example but not limited by 0V. By the operations, the gate-source voltage of the selected memory cell SMC is +12−(−10V)=+22V and thus the selected memory cells SMC are under stress recovery. The gate-source voltage of the unselected memory cell is +10V, +8V or −4V and thus the unselected memory cell is not under stress recovery. By the operations, the selected memory cells SMC are under stress recovery. Of course, the voltage values are for example and the application is not limited by.

That is, in one embodiment of the application, in stress recovery, the gate-source voltage of the selected memory cell is high-level voltage (for example but not limited by, +22V).

In one embodiment of the application, in stress recovery, the local source decoder conducts a global source line voltage to a fourth target memory cell of the memory cells; and the local bit line decoder conducts the global source line voltage to the fourth target memory cell of the memory cells.

Figure 6:
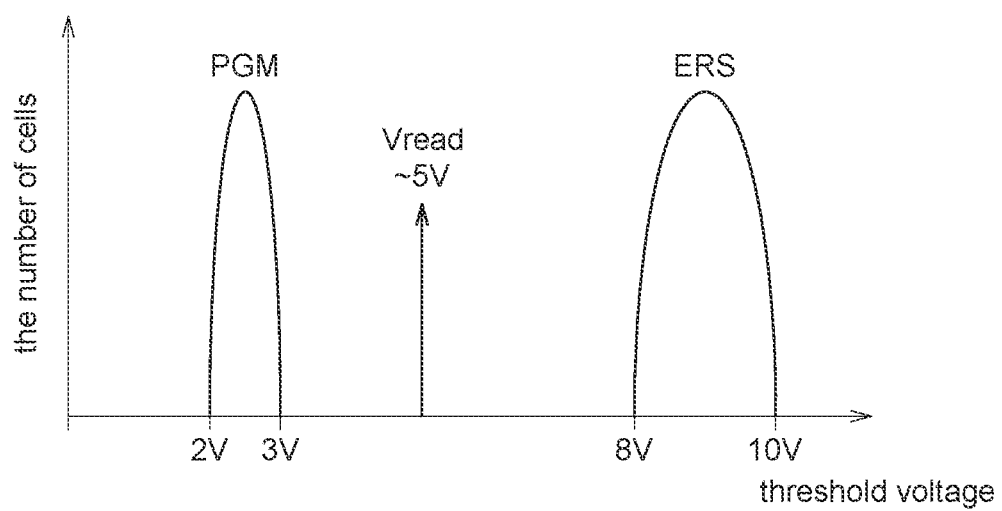
FIG. 6 shows threshold voltage (Vt) distribution according to one embodiment of the application.

FIG. 6 shows threshold voltage (Vt) distribution according to one embodiment of the application. As shown in FIG. 6, in programming (PGM), the threshold voltage (Vt) distribution of the programmed memory cells is about between 2V to 3V, lower than the read voltage Vread (for example but not limited by, 5V); and in erase (ERS), the threshold voltage (Vt) distribution of the erased memory cells is about between 8V to 10V, higher than the read voltage Vread.

Thus, in one embodiment of the application, the over erase issued is prevented. The threshold voltage distribution is improved even if a single erase pulse is applied. Thus, one embodiment of the application has advantage of high speed erase.

Further, in one embodiment of the application, as shown in FIG. 6, the threshold voltage Vt is narrow, which improves the read accuracy.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device comprising:
a memory array including a plurality of memory cells;
a first local signal line decoder coupled to the memory array;
a second local signal line decoder coupled to the memory array; and
a controller coupled to and controlling the memory array, the first local signal line decoder and the second local signal line decoder,
wherein
the first local signal line decoder comprises a plurality of first CMOS units correspondingly coupled to a plurality of first local signal lines; and the second local signal line decoder comprises a plurality of second CMOS units corresponding coupled to a plurality of second local signal lines;
in programming, a threshold voltage distribution of the memory cells is lower than a read voltage; and
in erase, the threshold voltage distribution of the memory cells is higher than the read voltage;
wherein each of the plurality of the first CMOS units and the plurality of the second CMOS units comprises an NMOS transistor, a PMOS transistor and a connection node shared and directly connected by the NMOS transistor and the PMOS transistor, the connection nodes of the plurality of the first CMOS units and the plurality of the second CMOS units are directly connected to the corresponding first local signal lines and second local signal lines;
wherein in programming, the PMOS transistor of the first CMOS unit coupled to a first target memory cell is turned on, and the PMOS transistor of the second CMOS unit coupled to the first target memory cell is turned on.

2. The memory device according to claim 1, wherein in reading, the first local signal line decoder conducts a first global signal line voltage to a second target memory cell of the memory cells; and the second local signal line decoder conducts a second global bit line voltage to the second target memory cell of the memory cells, the second global signal line voltage is higher than the first global signal line voltage.

3. The memory device according to claim 1, wherein in programming, the first local signal line decoder conducts a second global signal line voltage to the first target memory cell of the memory cells; and the second local signal line decoder conducts the second global signal line voltage to the first target memory cell of the memory cells.

4. The memory device according to claim 1, wherein in erase, the first local signal line decoder conducts a first global signal line voltage to a third target memory cell of the memory cells; and the second local signal line decoder conducts the first global signal line voltage to the third target memory cell of the memory cells.

5. The memory device according to claim 1, wherein in stress recovery, the first local signal line decoder conducts a first global signal line voltage to a fourth target memory cell of the memory cells; and the second local signal line decoder conducts the first global signal line voltage to the fourth target memory cell of the memory cells.

6. The memory device according to claim 1, further including a plurality of first local signal lines coupled to the memory array and the first local signal line decoder; and a plurality of second local signal lines coupled to the memory array and the second local signal line decoder.

7. The memory device according to claim 1, wherein in reading, the NMOS transistor of the first CMOS unit coupled to a second target memory cell is turned on, and the PMOS transistor of the second CMOS unit coupled to the second target memory cell is turned on.

8. The memory device according to claim 1, wherein in erase, the NMOS transistor of the first CMOS unit coupled to at least one third target memory cell is turned on, and the NMOS transistor of the second CMOS unit coupled to the at least one third target memory cell is turned on.

9. The memory device according to claim 1, wherein in stress recovery, the NMOS transistor of the first CMOS unit coupled to a fourth target memory cell is turned on, and the NMOS transistor of the second CMOS unit coupled to the fourth target memory cell is turned on.

10. The memory device according to claim 1, wherein the NMOS transistors of the plurality of first CMOS units and the plurality of second CMOS units are coupled to a first global signal line.

11. The memory device according to claim 1, wherein the PMOS transistors of the plurality of first CMOS units and the plurality of second CMOS units are coupled to a second global signal line.

12. An operation method for a memory device including a first local signal line decoder, a second local signal line decoder and a memory array having a plurality of memory cells, the operation method comprising:
in programming, applying a second global signal line voltage to a first target memory cell among the memory cells, wherein a first threshold voltage distribution of the first target memory cell is lower than a read voltage; and
in erase, applying a first global signal line voltage to a second target memory cell among the memory cells, wherein a second threshold voltage distribution of the second target memory cell is higher than the read voltage;
wherein both the first local signal line decoder and the second local signal line decoder include a plurality of CMOS units;
wherein the first local signal line decoder comprises a plurality of first CMOS units correspondingly coupled to a plurality of first local signal lines; and the second local signal line decoder comprises a plurality of second CMOS units corresponding coupled to a plurality of second local signal lines;
wherein each of the plurality of the first CMOS units and the plurality of the second CMOS units comprises an NMOS transistor, a PMOS transistor and a connection node shared and directly connected by the NMOS transistor and the PMOS transistor, the connection nodes of the plurality of the first CMOS units and the plurality of the second CMOS units are directly connected to the corresponding first local signal lines and second local signal lines;
wherein in programming, the PMOS transistor of the first CMOS unit coupled to the first target memory cell is turned on, and the PMOS transistor of the second CMOS unit coupled to the first target memory cell is turned on.

13. The operation method for a memory device according to claim 12, wherein in reading, the first global signal line voltage is conducted to a first terminal of a third target memory cell; the second global signal line voltage is conducted to a second terminal of the third target memory cell; and the second global signal line voltage is higher than the first global signal line voltage.

14. The operation method for a memory device according to claim 12, wherein in programming, the second global signal line voltage is conducted to a first terminal of the first target memory cell; and the second global signal line voltage is conducted to a second terminal of the first target memory cell.

15. The operation method for a memory device according to claim 12, wherein in erase, the first global signal line voltage is conducted to a first terminal of the second target memory cell of the memory cells; and the first global signal line voltage is conducted to a second terminal of the second target memory cell.

16. The operation method for a memory device according to claim 12, wherein in stress recovery, the first global signal line voltage is conducted to a first terminal of a fourth target memory cell of the memory cells; and the first global signal voltage is conducted to a second terminal of the fourth target memory cell.

\* \* \* \* \*